US006115586A

United States Patent [19]

Bezzam et al.

[11] Patent Number: 6,115,586

[45] Date of Patent: Sep. 5, 2000

[54] MULTIPLE LOOP RADIO FREQUENCY SYNTHESIZER

[75] Inventors: Ignatius Bezzam, Mountain View; Herbe Q. H Chun, Milpitas; Gregory Richmond, Sunnyvale, all of Calif.

[73] Assignee: Integrated Circuit Systems, Inc., Valley Forge, Pa.

[21] Appl. No.: 08/993,488

[22] Filed: Dec. 18, 1997

Related U.S. Application Data

[60] Provisional application No. 60/048,216, May 30, 1997.

[51] Int. Cl.[7] .................................................... H04B 1/04

[52] U.S. Cl. ........................ 455/112; 455/113; 455/118; 455/126; 455/76; 332/117; 327/105; 327/113

[58] Field of Search .................................. 455/110, 111, 455/112, 113, 91, 118, 119, 75, 76, 260, 126; 331/2; 332/127, 128, 117; 327/105, 113, 147, 156

[56] References Cited

U.S. PATENT DOCUMENTS

| | | | |
|---|---|---|---|
| 4,528,522 | 7/1985 | Matsuura | 455/76 X |
| 4,602,225 | 7/1986 | Miller et al. | 455/76 X |
| 4,627,099 | 12/1986 | Shimakata | 455/76 |
| 5,625,324 | 4/1997 | Hsu et al. | 331/2 |
| 5,790,942 | 8/1998 | LeCorre et al. | 455/110 X |

*Primary Examiner*—Fan Tsang
*Assistant Examiner*—Philip J. Sobutka
*Attorney, Agent, or Firm*—Skjerven, Morrill, MacPherson, Franklin & Friel LLP

[57] ABSTRACT

A radio frequency synthesizer receives a relatively low frequency input signal and synthesizes from it a high frequency output signal whose frequency can be programmed to change in fine steps, for use e.g. in cordless telephone. The frequency synthesizer includes three linked phase locked loops with a single side band mixer in one embodiment coupling two of the phase locked loops together. This provides an output signal free of in-band frequency spurs within the spacing of two channels. The synthesizer can be integrated in a single chip with a narrowband FM modulation circuit. In spite of using a novel synthesizer to achieve monolithic integration, the user programming interface and control value equations are the industry standard format.

16 Claims, 7 Drawing Sheets

÷ 2
÷ P
P.D.
VCO
÷ D
÷ 2
÷ N
÷ 2%
÷ A
÷ P 12Q
0°
90°
$f_{out}$
R1
C1
R2
C2
R3
C3

MULTIPLE LOOP RADIO FREQUENCY SYNTHESIZER

CROSS-REFERENCE TO RELATED APPLICATION

This application claims priority to provisional U.S. patent application Ser. No. 60/048,216 filed May 30, 1997.

BACKGROUND OF THE INVENTION

1. Field of the Invention

This invention relates to generation of radio frequency signals and more specifically to a multiple phase locked loop frequency synthesizer.

2. Description of the Prior Art

Generally any electronic device operating at radio frequencies requires generation of local oscillator (LO) high frequency signals. This is true of radio transmitters and receivers, for instance of the type included in cellular telephones, cordless telephones, television sets, etc. Local oscillators typically used in wireless communications require a very high frequency; e.g., a digital cordless telephone requires a 900 MHz oscillator frequency.

Implementation of these high frequencies in the prior art requires relatively expensive circuitry, an example of which is the National Semiconductor Corp. LMX9301 hybrid frequency synthesizer. This device uses co-fired ceramic external components for the VCO (voltage controlled oscillator) and loop filter. A block diagram of this device including the required external components is shown in FIG. 1. This device has only one PLL (phase locked loop) so that the phase noise of the loop is dominated by the size of the feedback divider which is directly related to the VCO output frequency channel spacing. While this device achieves adequate channel spacing, it generates unwanted reference spurs at the channel spacing frequency. In addition, use of this device requires the external VCO as shown in FIG. 1 which contains a non-integrable high Q inductor. (Non-integrable means this cannot be located on an integrated circuit with the other elements of the circuit). Single chip synthesizers which do not require external components do not provide adequate channel spacing and also require external component filters.

The FIG. 1 circuit has an input terminal 10 to which is applied an oscillating frequency $f_{OSC}$ which is coupled to a divide by R digital element 14 which in turn drives one terminal of a phase comparator 16. The output terminal of the phase comparator 16 drives a charge pump 20. The external components include the loop filter 26 and the VCO 30 which require the above-mentioned low temperature co-fired ceramic fabrication technology. The output signal of the VCO 30 in turn drives a divide by N element 32 which is coupled to the second input terminal of phase comparator 16. The desired output signal frequency is the output signal frequency of the VCO 30.

Hence it would be desirable to have a circuit for generating a high frequency which does not require the external components of FIG. 1 and also generates less phase noise.

SUMMARY

In accordance with this invention a frequency synthesizer and a method of operating same include three phase locked loops, each with its own division factor. The division factors (frequency multipliers) in one embodiment are programmable and correspond to the industry standard. A single side band mixer couples two of the phase locked loops. Any spurs in the output signal are at a frequency much greater than that of the channel spacing, within the loop band width and are eliminated from the output signal. The use of the single side band mixer allows elimination of expensive band pass filter components, and hence there is no need for any off-chip filter components.

Also in accordance with the invention, a method and circuit for narrow band frequency modulation uses a mixer and a summer to achieve a narrow band frequency modulated (FM) output signal. Advantageously, only a single input frequency is needed and phase noise is minimized.

DETAILED DESCRIPTION

Figure 1:
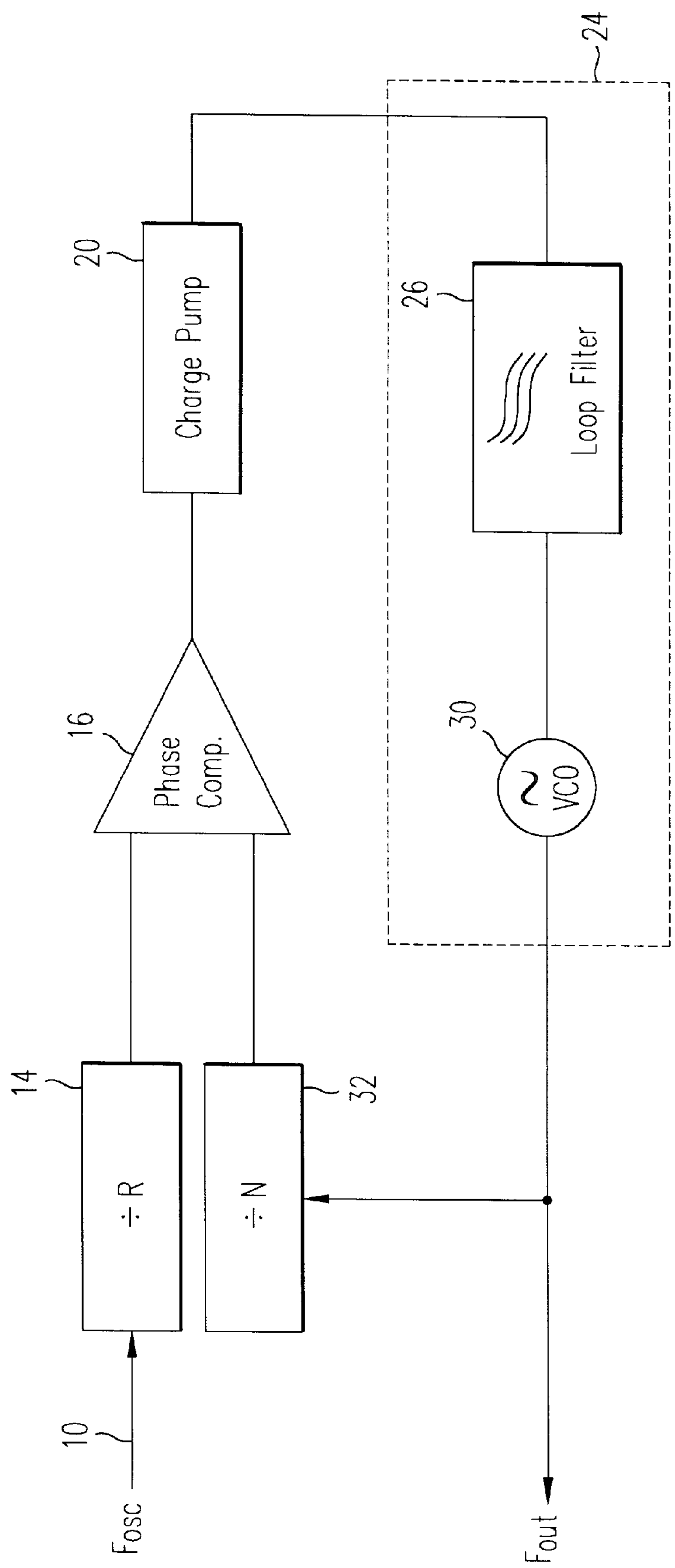
FIG. 1 shows a prior art frequency synthesizer.
Figure 2:
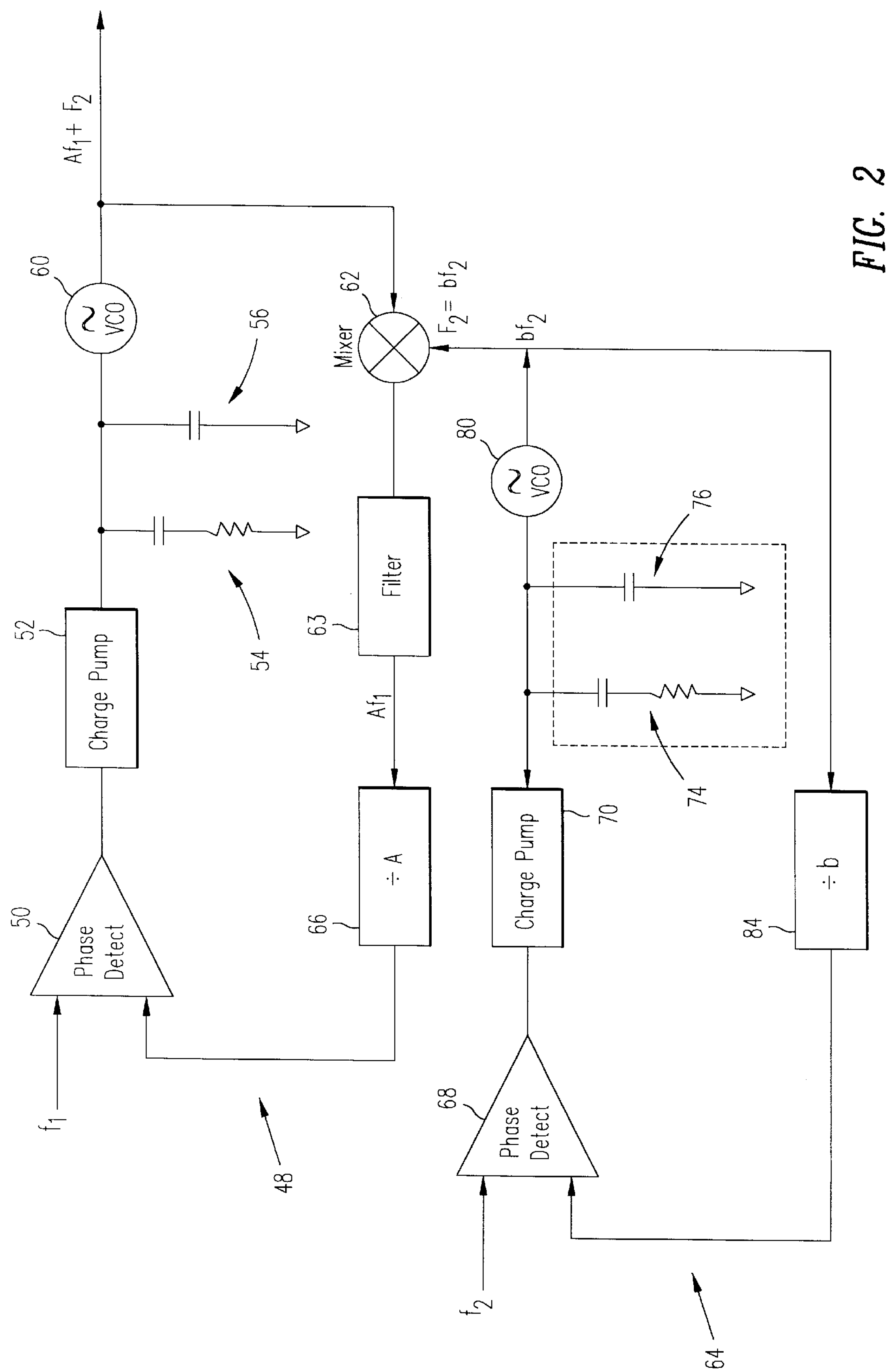
FIG. 2 shows a double phase locked loop frequency synthesizer.

FIG. 2 shows a double loop frequency synthesizer using multiple phase lock loops with a mixer coupling the phase locked loops. Since mixers are non-linear devices, the phase noise of the phase locked loops is uncorrelated. Hence the final output phase noise is related to the square-root of the sum of the square of the values of the frequency dividers. Since the sum of the square of two large numbers is much less than the product of the square of the two numbers, this circuit provides a better close-in phase noise for the frequency synthesizer. (Close-in phase noise is the phase noise close to the synthesizing frequency, typically within the loop band width.) Furthermore, by providing a loop filter with a bandwidth above the channel spacing, the need for an external high Q VCO is eliminated.

Frequency mixers are well known in the RF field and are used in radio and television receivers. A mixer has two input terminals which typically receive respectively two input sinusoidal signals. The two output signals out of the mixer are typically the difference between the two input frequencies and the sum of the two input frequencies. These output signals are referred to as the two sidebands. A variety of mixer circuits are known in the art, and hence further detail of the mixers used herein is not disclosed since anyone of a variety of such mixers are suitable. For instance, the well known FET mixer is suitable for the FIG. 2 circuit, as are other types of mixers.

The FIG. 2 circuit includes two phase locked loops. The first loop is the upper loop 48 which includes a phase detector 50 driven by the first input frequency f1. The phase detector 50 in turn drives a conventional charge pump 52, the output signal of which is coupled via a pole-zero loop filter 54, 56 to a VCO 60 which outputs the frequency $A \cdot f_1 + F_2$, which in turn is coupled to the first input terminal of the conventional mixer 62 which outputs a frequency $A \cdot f_1$, when filtered by an appropriate low pass or band pass filter 63. This signal in turn is applied to the input terminal of the divide by A element 66 which in turn is coupled to the second terminal of phase detector 50. This is, in one embodiment, an analog phase locked loop to reduce noise in the loop band width.

The lower phase locked loop 64 in FIG. 2 includes a phase detector 68 driven by the second input frequency $f_2$. The phase detector 68 in turn drives the charge pump 70, the output signal of which is applied via another pole-zero loop filter 74, 76 to the input terminal of a VCO 80 which in turn outputs the signal having frequency $b \cdot f_2$ (where $F_2 = b \cdot f_2$) which is applied to the second terminal of mixer 62. The remaining portion of the lower loop includes the divide by b element 84, the output terminal of which is coupled to the second input terminal of phase detector 68. Again, in one embodiment this second PLL 64 is an analog PLL to reduce noise.

Figure 3:
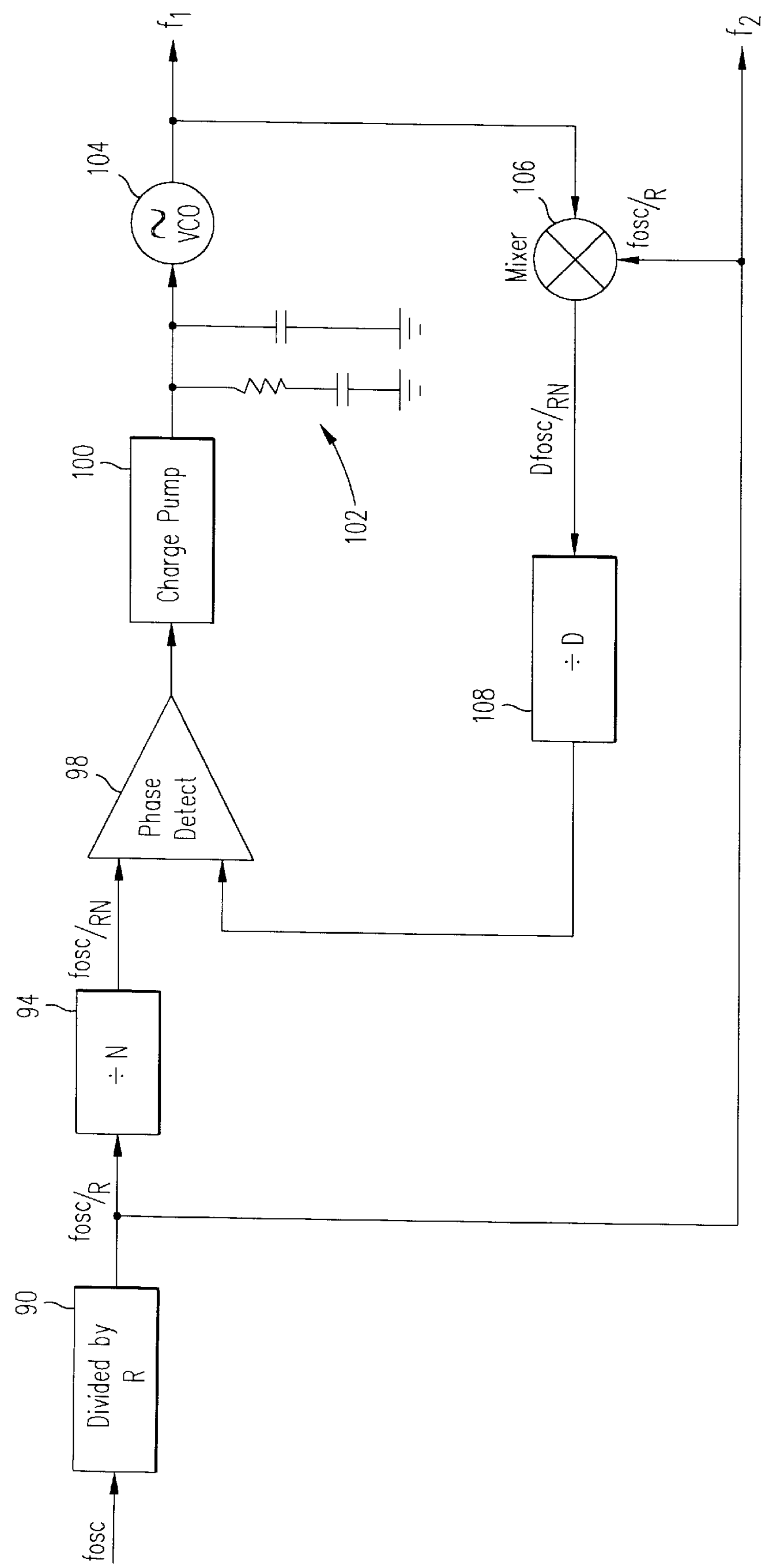
FIG. 3 shows frequency generation for the circuit of FIG. 2.

In one embodiment the signals $f_1$ and $f_2$ are each generated by the circuit shown in FIG. 3, which includes a third phase locked loop. This circuit is driven by an input signal $f_{ocs}$ from an oscillator (for instance an off-chip oscillator) which in turn drives a divide by R element 90. The output signal having frequency $f_{OSC}/R$ is applied to the input terminal of the divide by N element 94, the output signal of which is applied to the first terminal of a phase detector 98.

The phase detector 98 in turn drives a charge pump 100, the output signal of which is coupled to the input terminal of a VCO 104 via loop filter 102. The output signal from VCO 104 is the first output signal $f_1$ used in the FIG. 2 circuit. The lower portion of the phase locked loop includes a mixer 106 which in turn drives the divide by D element 108 outputting a signal having frequency $D \cdot f_{OSC}/RN$. The output signal of the divide by D element 108 is coupled to the second input terminal of phase detector 98. As shown, the signal having frequency $f_{OSC}/R$ is thereby applied to the second terminal of mixer 106 and is also the output signal $f_2$. The difference between $f_1$ and $f_2$ can thus be set as an arbitrary fraction of $f_{OSC}/R$. This difference actually sets the lower limit of the output frequency resolution of the entire synthesizer. For this circuit, $f_{out} = A \cdot f_1 + A \cdot f_2$, and minimum $(f_{out1} - f_{out2}) \geqq - |f_1 - f_2|$, $$\text{where } f_1 = \frac{fosc}{R} + \frac{Dfosc}{RN} = \frac{fosc}{R} \cdot (1 + D/N),$$

$$\text{and } f_2 = fosc/R;$$

$$f_1 - f_2 = \frac{fosc}{R}\left(\frac{D}{N}\right) = \Delta f,$$

where $\Delta f$ is the frequency spacing.

This occurs through the mixing of reference spurs from two PLLs, which results in unwanted spurious signals in band. (Reference spurs are spurious output signals occurring in a PLL at the phase detector rate or multiples thereof.)

The circuit shown in FIGS. 2 and 3 is only one approach to such a triple loop frequency synthesizer. In another version, the signals $f_1$ and $f_2$ have frequencies which are instead provided from a phase locked loop which includes a frequency multiplier so that signals $f_1$ and $f_2$ are simple multiples of one or another. In this case, when the reference spurs of coupled PLLs mix, the outputs are still at some multiple of the phase detector rates.

Figure 4:
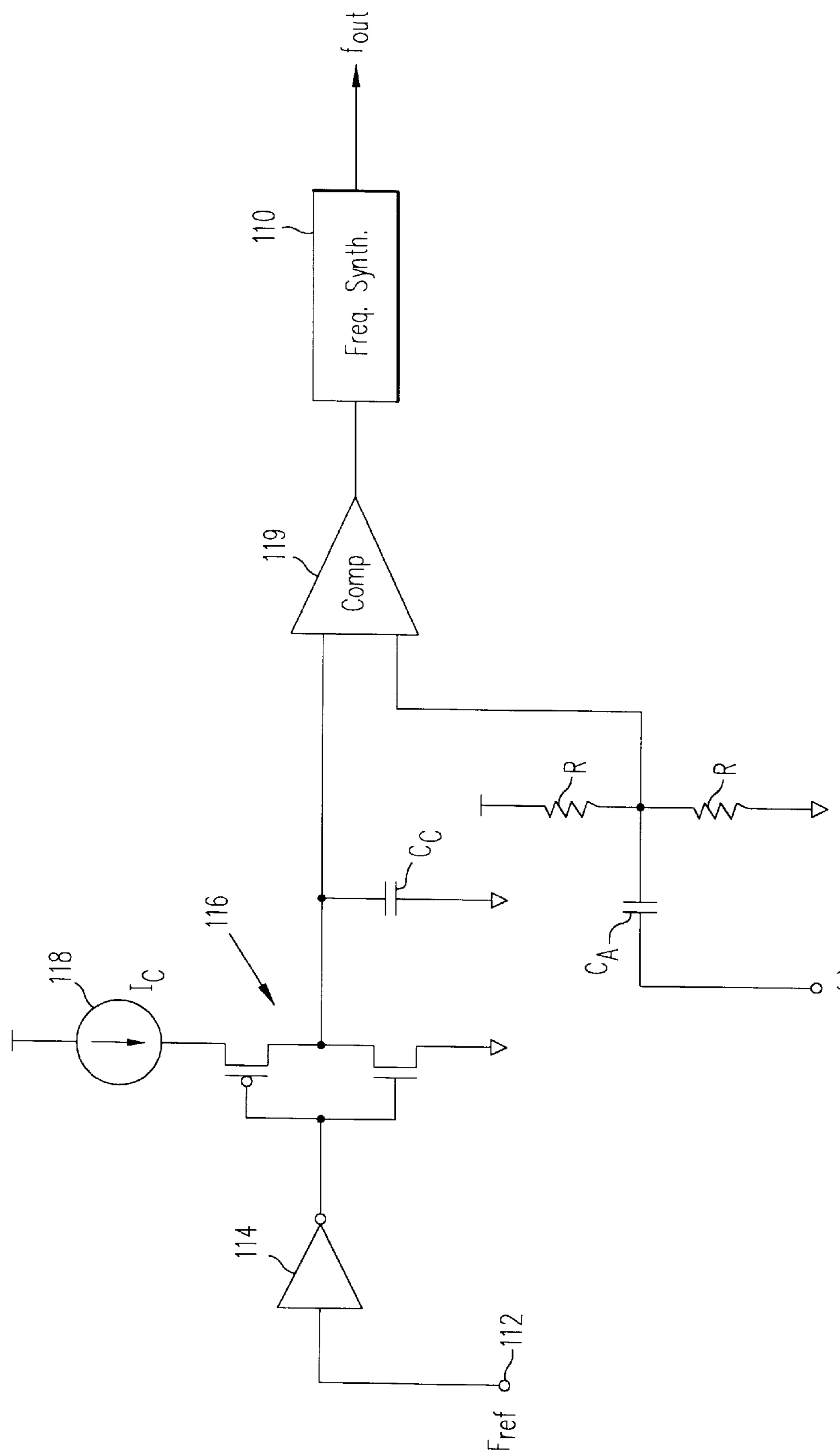
FIG. 4 shows phase modulation for the circuit of FIG. 2.

FIG. 4 shows application of the circuit of FIGS. 2 and 3 in a phase modulator where the frequency synthesizer 110 is the circuitry of FIGS. 2 and 3. The following equations explain operation of this circuit:

$$I_c = C_c \cdot V_{p-p} / ((1/2) \cdot T_{ref})$$

$$I_c = C_c \cdot 2 \cdot V_{p-p} f_{ref},$$

where $T_{ref}$ is merely the period defined by frequency $f_{ref}$. $C_c$ is the capacitance of the capacitor $C_c$, and $V_{p-p}$ is peak-to-peak voltage.

$f_{ref}$ is the frequency of the signal output from a fixed frequency oscillator 112 which drives inverter 114 and a nonlinear amplifier 116. A current source 118 is coupled to amplifier 116, which drives one terminal of comparator 119, the other input terminal of which is coupled to voltage source $V_{in}$ via a second capacitor $C_A$ and resistors R. The output signal from frequency synthesizer 110 is $f_{out}$. Of course this is only one application of the present frequency synthesizer of FIGS. 2 and 3.

Figure 5:
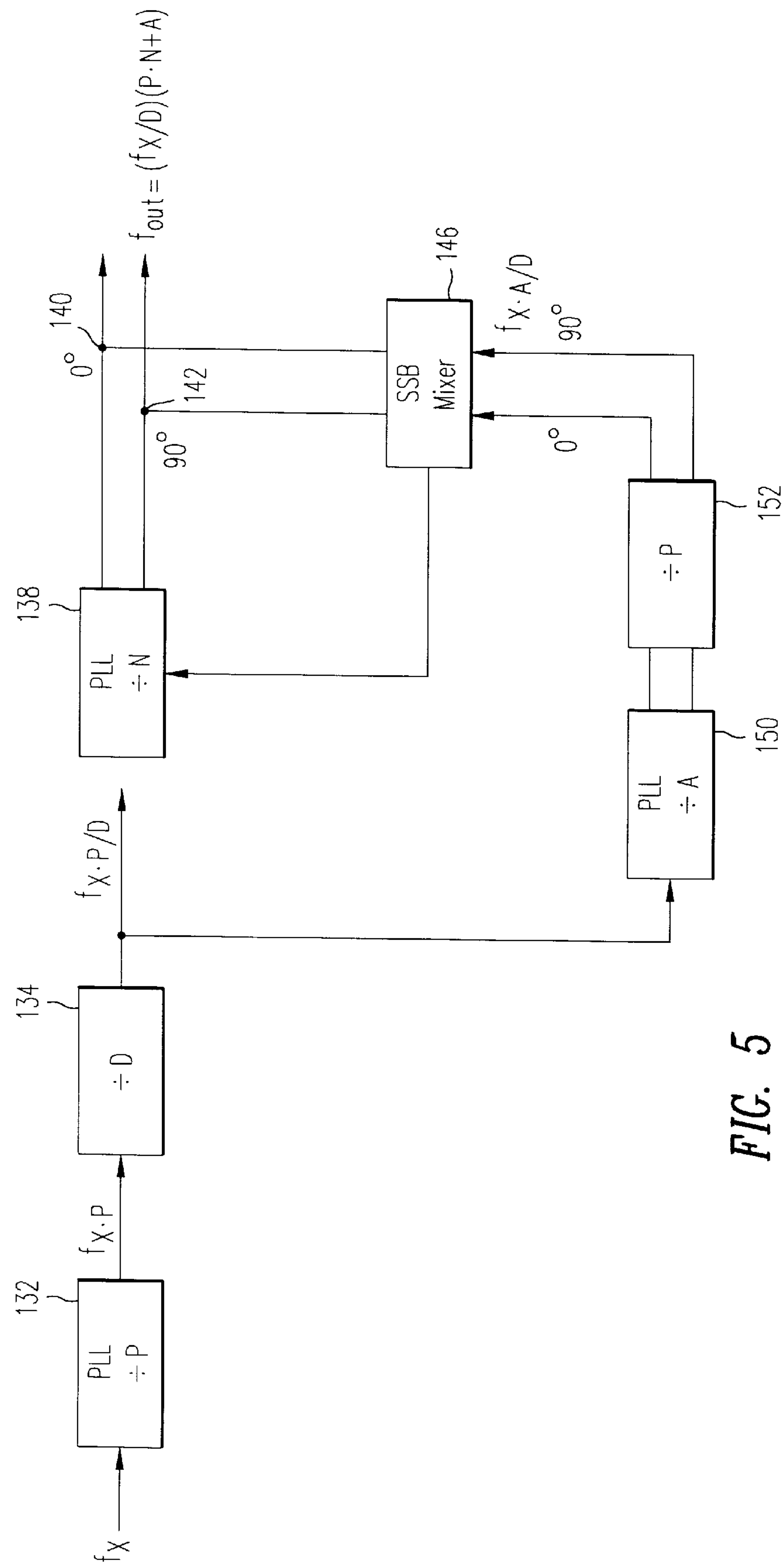
FIG. 5 shows a triple phase locked loop frequency synthesizer.

The FIG. 2 circuit has been found to subject to several improvements, which are embodied in the FIG. 5 circuit which is a triple phase lock loop frequency synthesizer using a mixer. A difference between the FIG. 5 and FIG. 2 circuits is that there is only a single input frequency $f_x$ to the first phase locked loop in FIG. 5. In FIG. 5 the input signal having frequency $f_x$ is supplied externally or by an on-chip frequency generator; $f_x$ is a relatively low frequency which can be conveniently generated. Also, instead of using the ordinary mixer 62 of FIG. 2, the FIG. 5 circuit uses a single side band mixer.

Input frequency $f_x$ is applied to the input terminal of a first phase locked loop 132 which includes a divide by P element 172, where P is some convenient value, for instance 64. (It is to be understood that a phase locked loop which includes a divider element multiplies the input frequency by the division factor.) Hence phase locked loop 132 outputs a signal having a frequency $f_x \cdot P$, which is applied to the input terminal of divide by D element 134. Hence elements 132 and 134 in FIG. 5 in effect perform the function of the FIG. 3 circuit, with reference to the FIG. 2 frequency synthesizer. Loop 132 is digital or analog; loops 138, 150 and mixer 146 are preferably (not necessarily) analog to minimize phase noise.

The output signal from the divide by D element 134 drives the second phase locked loop 138 and also the third phase locked loop 150. The second phase locked loop 138 includes a divide by N element, and outputs two signals on output nodes 140 and 142 which are respectively in phase (0°) and in quadrature (out of phase by 90° to the first signal). This is achieved as explained below.

The third phase locked loop 150 includes a divide by A element and receives the divided by D signal from element 134 which feeds into a divide by P element 152, which outputs two signals having the same frequency and at 0° and 90° phase which in turn are respectively coupled to two input terminals of the single side band mixer 146. The other two input terminals of the single side band mixer 146 are coupled to nodes 140, 142. The output signal from the single sideband mixer 146 in turn is coupled back into the second phase locked loop 138. Hence the actual output signals $f_{out}$ are provided at nodes 140 and 142, and in this case the output signals $f_{out}$ each have a frequency equal to $(f_x/D) \cdot (P \cdot N + A)$.

Figure 6:
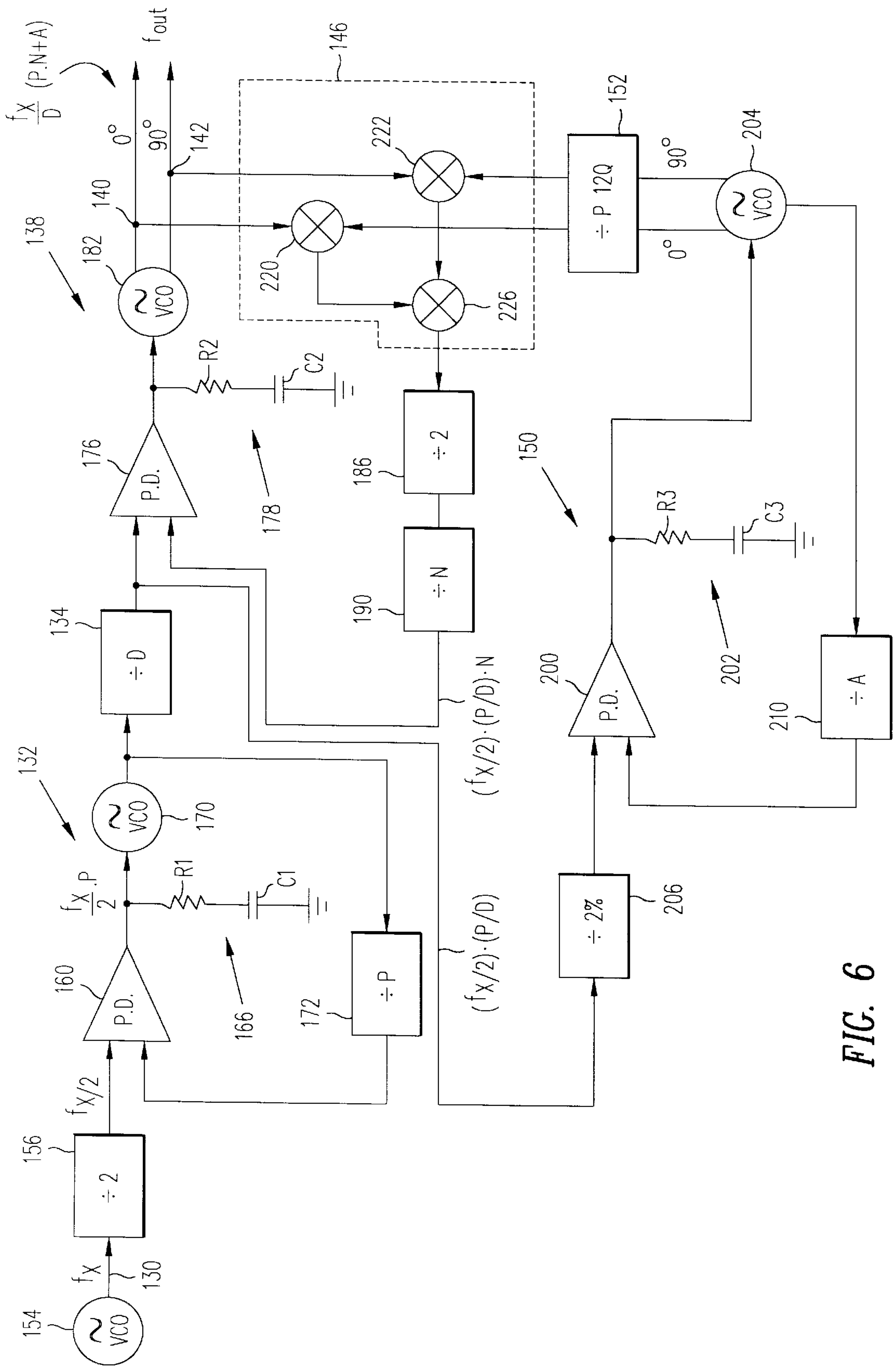
FIG. 6 shows detail of the FIG. 5 circuit.

FIG. 6 shows more detail of one embodiment of the FIG. 5 circuit. Elements in FIG. 6 similar to those in FIG. 5 have identical reference numbers. Typically $f_x$ is equal to 4 to 30 Mhz and is conventionally generated by oscillator 154 which has an associated crystal (not shown).

The input signal having frequency $f_x$ is coupled to a divide by 2 element 156 which outputs a signal having frequency $f_x/2$ which in turn is input to the first phase locked loop 132 which conventionally includes a phase detector (and charge pump) 160, a filter 166, having resistor R1 and capacitor C1, a VCO 170 and a divide by P element 172. Elements 156, 160, 172 may be digital or analog; in one embodiment elements 156, 172 are digital and element 160 is analog. The same is true of the other PLLs. These elements are conventional, except that in one embodiment the VCO 170 is of the type disclosed in U.S. Pat. No. 5,175,512 issued to Paul Self, incorporated herein by reference in its entirety, as is VCO 154. As seen, the signal output from the phase detector 160 in loop 132, due to the divide by P element 172, has a frequency of $(f_x/2)\cdot P$.

The output signal from loop 132 is in turn coupled to a divide by D element 134 (which is not a part of any of the phase locked loops). In this case the digital value D is an indication of the channel spacing, typically in kilohertz. The resulting signal having frequency $(f_x/2)\cdot P/D$ is input to the second phase locked loop 138 which includes a phase detector (and charge pump) 176, a filter 178 having resistor R2 and capacitor C2, a VCO 182, a divide by 2 element 186, and a divide by N element 190. Additionally, phase locked loop 138 is coupled to input signals at nodes 140, 142 to a single side band mixer 146 as shown.

The signal output by the divide by D element 134 and having frequency $(f_x/2)\cdot P/D$ is input to a divide by Q $(2^{q-1})$ element 206, the output signal of which is input to the third phase locked loop 150 including phase detector (and charge pump) 200, filter 202 having resistor R3 and capacitor C3, VCO 204, and a divide by A element 210. As shown, the output signal from VCO 204 is fed to another divider 152 of value P/2Q; the output signals of divider 206 are generated in quadrature (0° and 90°). The output signals of divider 152 are coupled into the other two input terminals of the single sideband mixer 146. The single side band mixer 146 conventionally includes two conventional mixers 220 and 222 and an adder/subtractor 226. The operation of this circuit is such that the output signals on nodes 140 and 142 each have frequency $(f_x/D)\cdot(P\cdot N+A)$, and these two signals are 90° out of phase (in quadrature) with one another, as shown.

For this circuit, $P=2^p$, where $p\geqq q$ and $P/2q=2^{p-q}$ where $Q=2^{q-1}$.

The various divider elements are conventional, and values P, D, A, Q and N may be programmable under microprocessor control (as is conventional in the art) or may be fixed values. The actual values are set by the user (in the programmable version) to achieve the desired output frequencies, is that by changing these values one generates different output frequencies. In one embodiment the value A is set less than P (64), for optimum performance, but this is not limiting.

Figure 7:
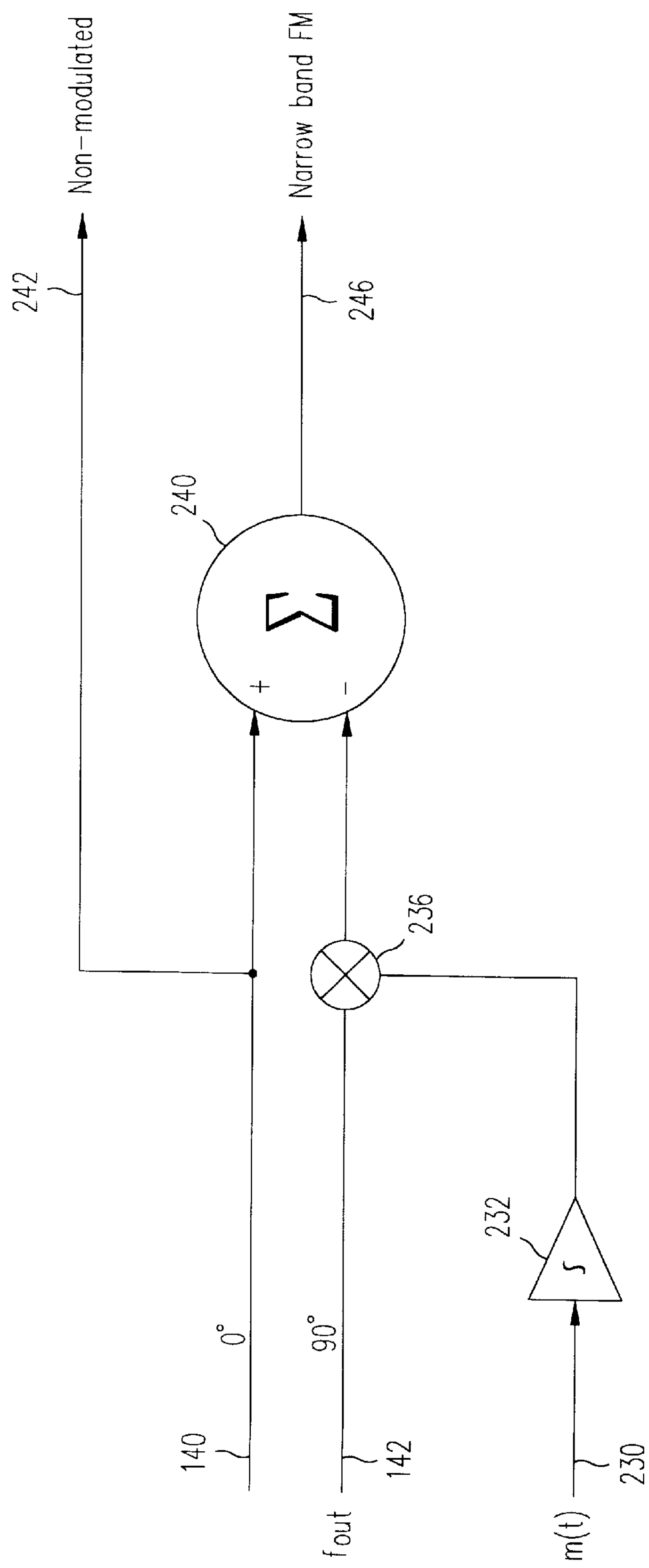
FIG. 7 shows a circuit for narrow band frequency modulation.

Another aspect in accordance with this invention is shown in FIG. 7. In this case the input terminals 140 and 142 carry, as shown in FIG. 6, the 0°, 90° output signals from the frequency synthesizer. It is to be appreciated that these are sinusoidal signals and do not carry any information (modulation) at this point. The circuit of FIG. 7 phase modulates this signal so that it carries information, as is typical for instance in radio communications (e.g., cordless telephony). For carriage of voice signals having a typical (audio) frequency of 10 KHz, one wants to provide an output RF signal having narrow band frequency modulation. The FIG. 7 circuit is intended to accomplish this.

The voice signal (conventionally converted to an electrical signal designated m(t)) is applied directly to terminal 230 of an integrator 232, the output terminal of which is coupled to a first input terminal of a mixer 236. (The integrator 232 in one embodiment is conventionally an operational amplifier with a capacitor connected across it and a fixed resistive feedback gain K.) The second input terminal of mixer 236 is coupled to node 142 which carries the quadrature (90°) $f_{OUT}$ signal. The output terminal of mixer 236 is coupled to a first input terminal of a summer 240, the other input terminal of which is coupled to terminal 140. The upper terminal 244 of summer 240 is a positive input terminal and the lower terminal 236 is a negative input terminal, so summer 240 is taking the difference between the two input signals. (Note that the FIG. 7 circuit may be on the same chip as the FIG. 6 circuit. Also, elements 236, 240 may be digital for digital data, or analog for analog data such as voice signals.) As shown, the non-modulated signal $f_{out}$ is provided directly at terminal 242 for purposes of demodulating incoming RF signals. This eliminates the need to switch ON/OFF the modulation of the synthesizer in talk/listen modes, for example, cordless telephoning applications.

The output terminal 246 of the summer 240 carries the narrow band frequency modulated signal (carrying the voice information). Thus the frequency modulating signal applied to the input terminal of mixer 236 is the integrated information signal. Formulas describing the operation of this circuit are as follows:

$$\cos(\omega ct+K\int m(t)=\cos(\omega ct)\cdot\cos(K\int m(t))-\sin(\omega ct)\cdot\sin(K\int m(t)).$$

For small values of a, $\cos(a)\approx1$, and $\sin(a)\approx a$, so this equals, approximately: $\cos(\omega ct)\cdot1-\sin(\omega ct)\cdot K\int m(t)$ where ω is the carrier frequency of signal $f_{out}$, m(t) is the information (voice) signal applied at terminal 230, and K is a constant scale factor. For voice information, m(t) is small (about 10 kHz, as stated above) so the approximation is valid. The FIG. 7 circuit carries out this approximation of frequency modulation using the mixer 236 to multiply and summer 240 to take the difference; the cos and sin of course are provided respectively by the 0° and 90° components of the multi-loop PLL of FIG. 5.

It is to be appreciated that the circuit of FIG. 7 may be used independently of that of FIGS. 5 and 6, and vice-versa. In the absence of integrator 232, phase modulation (PM) is realized by the FIG. 7 circuit.

This disclosure is illustrative but not limiting; further modifications will be apparent to one skilled in the art in light of this disclosure and are intended to fall within the scope of the appended claims.

We claim:

1. A frequency synthesizer comprising:

an input terminal for receiving an input signal having a first frequency $f_X$;

a first phase locked loop driven by the input signal and outputting a second signal having a second frequency $P\cdot f_x$, where P is an integer;

a second phase locked loop driven by the second signal and outputting a third signal having a third frequency which is an integer multiple of $P\cdot f_x$;

a third phase locked loop driven by the second signal; and a single side band mixer coupled between the second and third phase locked loops, wherein the single sideband mixer mixes the third signal and the output signal of the third phase locked loop and couples the mixed signal into the second phase locked loop.

2. The frequency synthesizer of claim 1, wherein the second phase locked loop includes a divide by N element, where N is an integer, and the third phase locked loop includes a divide by A element, where A is an integer, and an output signal of the second phase locked loop has a frequency proportional to $f_x(P\cdot N+A)$.

3. The frequency synthesizer of claim 2, where A is less than P and N is greater than P.

4. The frequency synthesizer of claim 2, wherein P, N and A are programmable.

5. The frequency synthesizer of claim 1, wherein all elements of the frequency synthesizer are on a single integrated circuit.

6. The frequency synthesizer of claim 1, wherein the second phase locked loop also outputs a fourth signal having the third frequency and which is 90° out of phase with the third signal.

7. The frequency synthesizer of claim 6, wherein the single sideband mixer includes:

a first mixer coupled to receive the third signal and the output signal from the third phase locked loop divided;

a second mixer coupled to receive the fourth signal and an additional output signal from the third phase locked loop and divider which is 90° out of phase with the output signal from the third phase locked loop; and an adder to sum output signals from the first and second mixers.

8. The frequency synthesizer of claim 1, wherein each phase locked loop includes in series:

a phase detector;

a filter;

an oscillator; and a divider.

9. The frequency synthesizer of claim 1, further comprising:

a divide by D element coupled between the first and second phase locked loops; and a divide by P/2q element coupled between the third phase locked loop and the single sideband mixer.

10. The frequency synthesizer of claim 6, further comprising a frequency modulation circuit coupled to receive the third and fourth signals at respectively its first and second input terminals, and including:

a summer having two input terminals, one input terminal being coupled to the first input terminal of the frequency modulation circuit; and a mixer having two input terminals, one input terminal being coupled to the second input terminal of the frequency modulation circuit and the second input terminal receiving a modulating signal;

wherein an output terminal of the mixer is coupled to a second input terminal of the summer, whereby the summer outputs a narrow band FM signal modulated by the modulating signal.

11. The frequency synthesizer of claim 10, wherein the summer subtracts the signal input at its second input terminal from the signal input at its first input terminal.

12. A method of synthesizing a signal from a lower frequency reference signal, comprising the steps of:

multiplying a frequency $f_x$ of the reference signal by a factor P in a first phase locked loop to generate a second signal;

applying the second signal to a second phase locked loop to multiply a frequency of the second signal by a factor N, to generate a third signal;

applying the second signal to a third phase locked loop to multiply a frequency of the second signal by a factor A, to generate a fourth signal; and single side band mixing the third and fourth signals and coupling the mixed signal into the second phase locked loop to generate an output signal having a frequency proportional to $f_x(P \cdot N+A)$.

13. The method of claim 12, further comprising the steps of:

dividing by a factor D the second signal prior to applying the second signal; and dividing the fourth signal by a factor P prior to the step of single sideband mixing.

14. A frequency modulation circuit coupled to receive two signals having the same frequency and in quadrature with one another at respectively its first and second input terminals, the circuit comprising:

a summer having two input terminals, one input terminal being coupled to the first input terminal of the frequency modulation circuit; and a mixer having two input terminals, one input terminal being coupled to the second input terminal of the frequency modulation circuit and the second input terminal receiving an information bearing signal;

wherein an output terminal of the mixer is coupled to a second input terminal of the summer, whereby the summer outputs a narrow band FM signal modulated by the information bearing signal.

15. The frequency modulation circuit of claim 14, wherein the summer subtracts the signal input at its second input terminal from the signal input at its first input terminal.

16. The frequency modulation circuit of claim 14, further comprising an integrator coupled to the second input terminal of the mixer to receive the information bearing signal.

* * * * *